United States Patent [19]
Adcox

[11] Patent Number: 5,351,046
[45] Date of Patent: Sep. 27, 1994

[54] METHOD AND SYSTEM FOR COMPACTING BINARY CODED DECIMAL DATA

[76] Inventor: Thomas A. Adcox, 3621 Sherrye Pl., Plano, Tex. 75074

[21] Appl. No.: 68,899

[22] Filed: May 28, 1993

[51] Int. Cl.5 .................................. H03M 7/12
[52] U.S. Cl. ................................ 341/62; 341/95
[58] Field of Search ............... 341/62, 51, 55, 67, 341/104, 105, 106

[56] References Cited

U.S. PATENT DOCUMENTS

| | | |
|---|---|---|
| 3,772,654 | 11/1973 | Evans et al. ............... 341/106 |
| 3,912,210 | 11/1975 | Halpern . |
| 3,993,862 | 11/1976 | Karr . |
| 4,267,568 | 5/1981 | Dechant et al. . |
| 4,464,650 | 8/1984 | Eastman et al. . |
| 4,520,506 | 5/1985 | Chan et al. . |
| 4,536,801 | 8/1985 | Torkelson et al. . |
| 4,558,302 | 12/1985 | Welch . |
| 4,580,134 | 4/1986 | Campbell et al. . |
| 4,635,141 | 1/1987 | Coulter . |
| 4,654,877 | 3/1987 | Shimoni et al. . |
| 4,679,094 | 7/1987 | Rutherford et al. . |
| 4,698,672 | 10/1987 | Chen et al. . |
| 4,706,264 | 11/1987 | Cung . |
| 4,805,208 | 2/1989 | Schwartz . |
| 4,809,350 | 2/1989 | Shimoni et al. . |
| 4,841,299 | 6/1989 | Weaver . |
| 4,905,288 | 2/1990 | Gerson et al. . |
| 4,906,991 | 3/1990 | Fiala et al. . |
| 4,945,214 | 7/1990 | Hancock et al. . |
| 4,994,993 | 2/1991 | Asghar et al. ............... 364/740 |
| 5,087,913 | 2/1992 | Eastman . |
| 5,099,237 | 3/1992 | Fitingof . |
| 5,128,754 | 7/1992 | Dhein . |
| 5,133,079 | 7/1992 | Ballantyne et al. . |
| 5,162,908 | 11/1992 | Kim . |
| 5,204,756 | 4/1993 | Chevion et al. . |

*Primary Examiner*—Brian K. Young
*Attorney, Agent, or Firm*—Baker & Botts

[57] ABSTRACT

A method and system generate a compacted binary coded decimal (BCD) data set from a BCD digital data stream. The invention uses a translation matrix to translate blocks of data extracted from the BCD digital data stream. The BCD blocks are read to determine the number and position of 1's or 0's in the BCD block. The invention then generates a unique identifier number from a set of identifiers associated with either each of the 1's or each of the 0's. The result is a BCD number that has fewer BCD digits than the original BCD block. This process may be repeated numerous times to result in a compacted BCD data set that has fewer BCD digits but that can be translated back to the original BCD blocks that form the original BCD data stream.

15 Claims, 9 Drawing Sheets

| 0 | 1 | 1 | 0 | 0 | 0 | 0 | 0 |
|---|---|---|---|---|---|---|---|
| 0 | 0 | 0 | 1 | 0 | 0 | 0 | 0 |
| 1 | 0 | 1 | 0 | 0 | 0 | 0 | 0 |
| 0 | 0 | 1 | 0 | 0 | 0 | 0 | 0 |
| 1 | 1 | 1 | 0 | 0 | 0 | 0 | 0 |
| 1 | 1 | 0 | 0 | 0 | 0 | 0 | 0 |
| 0 | 1 | 1 | 0 | 0 | 0 | 0 | 0 |
| 1 | 0 | 0 | 1 | 0 | 0 | 0 | 0 |
| 1 | 0 | 0 | 1 | 0 | 0 | 0 | 0 |
| 0 | 1 | 1 | 0 | 0 | 0 | 0 | 0 |
| 0 | 1 | 0 | 0 | 0 | 0 | 0 | 0 |
| 0 | 0 | 0 | 0 | 0 | 0 | 0 | 0 |
| 0 | 1 | 0 | 0 | 0 | 0 | 0 | 0 |
| 0 | 0 | 0 | 0 | 0 | 0 | 0 | 0 |
| 1 | 1 | 1 | 0 | 0 | 0 | 0 | 0 |
| 1 | 1 | 0 | 0 | 0 | 0 | 0 | 0 |
| 0 | 1 | 0 | 0 | 0 | 0 | 0 | 0 |
| 0 | 0 | 0 | 0 | 0 | 0 | 0 | 0 |
| 0 | 1 | 1 | 0 | 0 | 0 | 0 | 0 |
| 1 | 0 | 0 | 0 | 0 | 0 | 0 | 0 |
| 0 | 1 | 1 | 0 | 0 | 0 | 0 | 0 |
| 1 | 0 | 1 | 0 | 0 | 0 | 0 | 0 |
| 1 | 1 | 1 | 0 | 0 | 0 | 0 | 0 |
| 0 | 0 | 1 | 0 | 0 | 0 | 0 | 0 |
| 1 | 1 | 1 | 0 | 0 | 0 | 0 | 0 |
| 0 | 0 | 1 | 0 | 0 | 0 | 0 | 0 |
| 1 | 1 | 1 | 0 | 0 | 0 | 0 | 0 |
| 1 | 1 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 1 | 0 | 0 | 0 | 0 | 0 | 0 |
| 0 | 0 | 0 | 0 | 0 | 0 | 0 | 0 |

"THIS IS A TEST"

*FIG. 1*

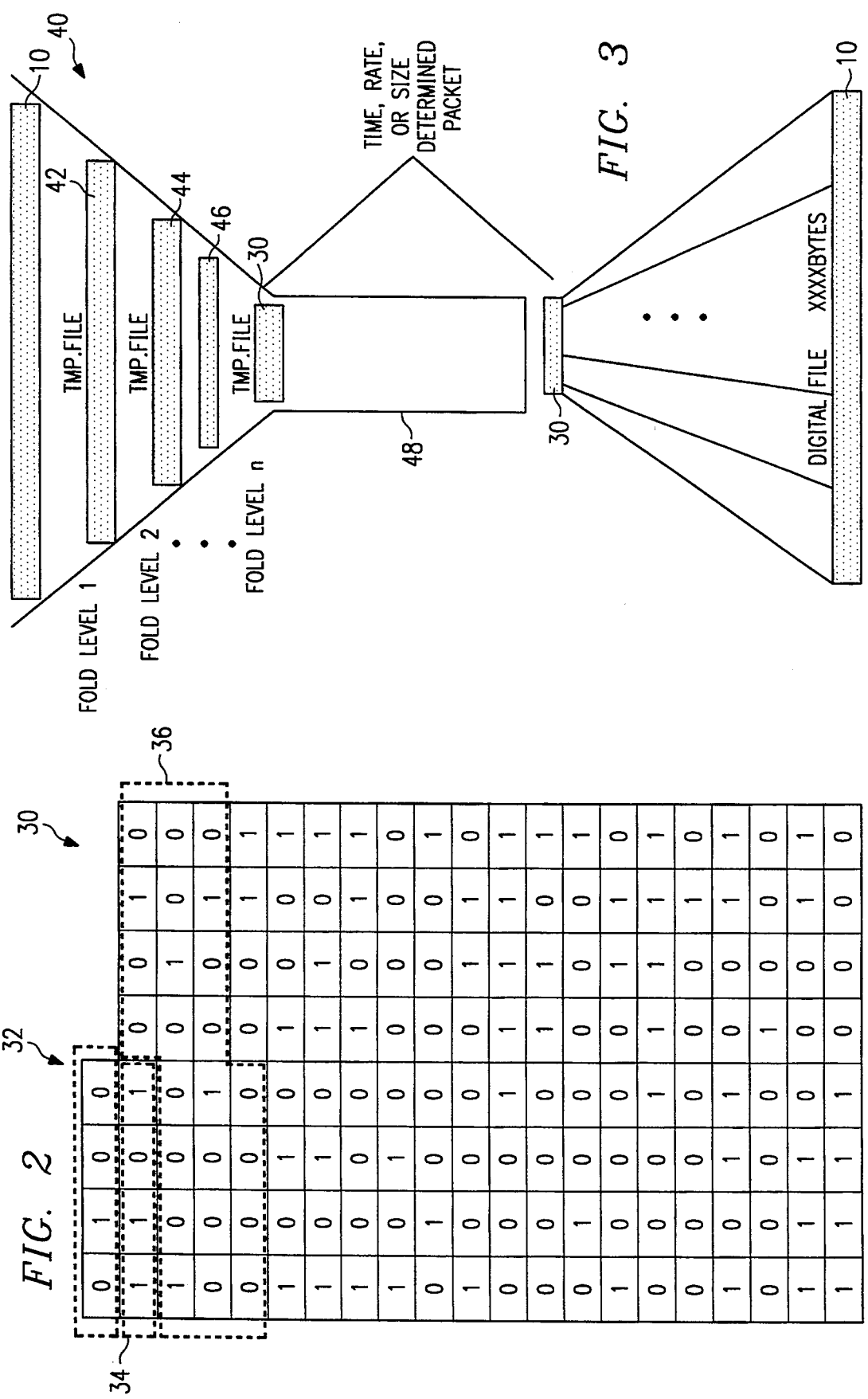

| | | | | | | | | |
|---|---|---|---|---|---|---|---|---|
| 9 | 0 | 1 85 | 0 | 0 | 0 | 1 85 | 0 | 0 |
| 10 | 0 | 1 162 | 1 162 | 0 | 0 | 0 | 0 | 0 |
| 11 | 0 | 0 | 1 310 | 0 | 0 | 1 310 | 1 310 | 0 |
| 12 | 1 595 | 0 | 0 | 0 | 0 | 0 | 0 | 0 |
| 13 | 0 | 0 | 0 | 0 | 0 | 0 | 0 | 0 |
| 14 | 0 | 0 | 0 | 0 | 0 | 0 | 0 | 0 |
| 15 | 0 | 0 | 0 | 0 | 0 | 0 | 0 | 0 |
| 16 | 0 | 0 | 0 | 0 | 0 | 0 | 0 | 0 |
| 17 | 1 16493 | 0 | 0 | 1 16493 | 0 | 1 16493 | 1 16493 | 0 |
| 18 | 0 | 1 30701 | 1 30701 | 1 30701 | 1 30701 | 1 30701 | 1 30701 | 1 30701 |
| 19 | 1 56783 | 1 56783 | 1 56783 | 1 56783 | 1 56783 | 1 56783 | 1 56783 | 0 |
| 20 | 0 | 0 | 0 | 0 | 0 | 0 | 0 | 0 |

| | 2409577 | 4732231 | 87957 | 3160361 | 1330837 | 2440078 | 3160675 | 30701 |
|---|---|---|---|---|---|---|---|---|
| LEVEL # | 6 | 9 | 5 | 6 | 4 | 8 | 9 | 1 |
| 1 | 1 0 | 1 1 | 1 1 | 0 | 0 | 0 | 1 1 | 0 |
| 2 | 1 2 | 1 2 | 0 | 1 2 | 1 2 | 1 2 | 1 2 | 0 |
| 3 | 1 3 | 1 3 | 0 | 0 | 0 | 1 3 | 1 3 | 0 |
| 4 | 0 | 0 | 1 | 0 | 0 | 0 | 0 | 0 |
| 5 | 0 | 0 | 0 | 0 | 0 | 0 | 0 | 0 |
| 6 | 0 | 0 | 0 | 0 | 0 | 0 | 0 | 0 |
| 7 | 0 | 0 | 0 | 0 | 0 | 0 | 0 | 0 |
| 8 | 0 | 0 | 0 | 0 | 0 | 0 | 0 | 0 |

| FOLD | 1 |
|---|---|
| BIT LEVEL | |
| 6 | 2409577 |
| 9 | 4732231 |
| 5 | 87957 |
| 6 | 3160361 |
| 4 | 1330837 |
| 8 | 2440078 |
| 9 | 3160675 |
| 1 | 30701 |

FIG. 6b (72)

| FOLD | 2 |
|---|---|
| BIT LEVEL | |
| 13 | 8478310 |
| 14 | 12099238 |
| 14 | 2012923 |
| 10 | 4081423 |
| 14 | 13103747 |
| 12 | 12837522 |
| 14 | 11942746 |

FIG. 6c (74)

| FOLD | 3 |
|---|---|
| BIT LEVEL | |
| 16 | 12050100 |
| 15 | 10675366 |
| 10 | 7298736 |
| 11 | 13365369 |
| 14 | 8253496 |
| 14 | 15933574 |

FIG. 6d (76)

| FOLD | 4 |
|---|---|
| BIT LEVEL | |
| 10 | 9996062 |
| 15 | 5080615 |
| 13 | 14987614 |
| 11 | 6350472 |
| 15 | 10204336 |

METHOD AND SYSTEM FOR COMPACTING BINARY CODED DECIMAL DATA

TECHNICAL FIELD OF THE INVENTION

The present invention relates to methods and systems for manipulating digital information and, more particularly, to a method and system for compacting binary coded decimal (BCD) data in order to reduce transmission time and storage requirements for BCD data without adversely affecting the BCD data quality.

BACKGROUND OF THE INVENTION

A wide variety of telecommunications, video display, and other electronic systems transmit binary coded decimal (BCD) data from one point to another. These transmissions may be via satellite, optical fiber, electrical wires, and other connections. In transmitting BCD data, a significant portion of the transmission time is spent transmitting data that is redundant or that is of only marginal valuable. Without some way to avoid transmitting much of this relatively valueless data, processing equipment speed may become the only parameter that can affect the data flow rate from one point to another.

Another important aspect of BCD digital data is that it consumes a significant amount of storage space. If a method existed to reduce the amount of space necessary to store BCD data and that did not sacrifice data accuracy, it would be possible to include within a memory or other storage device a significantly larger amount of information.

Recognizing these needs, numerous attempts exist to compress data from its original BCD form to a form that requires less transmission time, Once received, decompression of the transmitted data occurs in an attempt to re-generate the original BCD data. For example, video compression methods have been derived by the Joint Photographic Experts Group (JPEG), the Moving Picture Experts Group (MPEG), and an organization known as P*64. In general, these techniques remove certain pieces of data or pixels from the video image. These approaches generally fail, however, to properly address practical issues such as economy, quality, consumer acceptance and ease of access. For example, one of these methods is known as delta or differential coding and was derived by JPEG. This process looks at each scan line of a data block such as a television frame and compares it to the same line in a previous frame. If the information content has not changed, a simple signal to the receiver is all that is needed. There is no need to re-transmit the line. The television receiver retrieves the previous line from its memory and re-displays the data. If there is a change, on the other hand, only the changes (i.e., the delta part) is transmitted. This method eliminates data values to make the BCD files smaller.

An important limitation of this and other similar methods is that, as data values are removed to make data files smaller, a loss of data results. This data is generally not restored in any subsequent decompression or re-generation steps. Therefore, while such video compression techniques may yield significant compression ratios, as the ratios increase these techniques lose more data. This results in significant resolution losses, streaks, tears and picture break-ups.

Consequently, there is a need for a method and system that reduces the amount of time necessary to transmit BCD data from one point to another and that avoids the resolution losses, streaks, tears, picture break-ups and other problems associated with existing methods of compressing BCD data.

There is a need for a system of reducing BCD data storage requirements for a wide variety of applications that also avoids the limitations known BCD data compression techniques.

SUMMARY OF THE INVENTION

The present invention, therefore, provides a method and system for compacting or reducing the size of binary coded decimal (BCD) data files that overcomes or substantially reduces limitations associated with prior methods and systems of compressing data for both transmission and storage.

According to one aspect of the invention, there is provided a method for generating a compacted BCD data set from a BCD digital data stream. The method includes the steps of partitioning the BCD digital data stream into a plurality of BCD blocks. Each BCD block includes a predetermined equal number of digits. The method includes the steps of generating a translation matrix that has level rows such that each of the level rows has a unique row number that corresponds to a possible number of 1's in the BCD block. The translation matrix further has a plurality of identifier columns equal in number to the number of digits in the BCD block. Each identifier column uniquely corresponds to the relative position of one of the digits in the BCD block. Additionally, the translation matrix includes a plurality of identifiers. Each of the identifiers uniquely associates with one of the level rows and one of the identifier columns.

The method includes the step of setting a fold level parameter equal to a value of 1. Then, the method generates the compacted BCD data set from the plurality of BCD blocks and uses the translation matrix by sequentially performing the following steps on each of the BCD blocks. The first step is to read the BCD block and then determine the number of 1's in the BCD block. The next step is to identify the level row of the translation matrix that corresponds to the number of 1's in the BCD block. Then, the method takes the step of locating a set of identifiers in the corresponding level row such that each of the identifiers is within an identifier column that corresponds to the position of a 1 in the BCD block. Adding the set of identifiers to form a unique identifier number is the next step. Then, the method includes the step of storing the fold level parameter, the corresponding unique row number, and the unique identifier number in combination as a resulting BCD number. The resulting BCD number has fewer digits than the BCD block and is stored in sequence with any previously stored resulting BCD numbers. These steps are repeated on all BCD blocks of the digital data stream to produce a compacted BCD data set.

A technical advantage of the present invention is that it acts upon the information in a BCD data file to reduce the information to the smallest state desired for transmission and storage. In its compacted form, nothing of the original file is identifiable as the original BCD data without use of the translation matrix. After compaction, however, the data may be accurately expanded to precisely its original form. Using the method and system of the present invention, values of greater than 90-to-1 and even 120-to-1 are easily achievable.

Another technical advantage of the present invention is that it permits transmission of BCD data of any form including voice, data, or video information, to be moved from any one point to another without resolution losses that occur in conventional compassion techniques.

Another technical advantage of the present invention is that it permits compacting data with 100% regeneration. This makes it possible to reduce data storage file requirements for BCD data without losing valuable pieces of information.

BRIEF DESCRIPTION OF THE DRAWINGS

The invention and its modes of use and advantages are best understood by reference to the following description of illustrative embodiments when read in conjunction with the accompanying drawings, wherein:

FIG. 1 illustrates a BCD digital data stream that maybe formed into a plurality of BCD blocks upon which to apply the preferred embodiment;

FIG. 2 shows a compacted BCD data set derived from the BCD digital data stream of FIG. 1;

FIG. 3 conceptually illustrates a set of computational operations that the preferred embodiment may perform;

FIG. 4 shows an exemplary translation matrix formed consistent with certain concepts of the preferred embodiment;

FIGS. 5a through 5c illustrate one mode of using the translation matrix of FIG. 4 to translate the BCD digital data stream of FIG. 1 to reach a first fold level consistent with concepts of the preferred embodiment;

FIGS. 6a through 6d illustrate the decimal equivalent of the values for the bit level and additive identifier fields of intermediate fold levels that the preferred embodiment reaches in transforming the exemplary digital data stream of FIG. 1 to the compacted BCD data set of FIG. 2;

DETAILED DESCRIPTION OF THE INVENTION

Figure 7A:
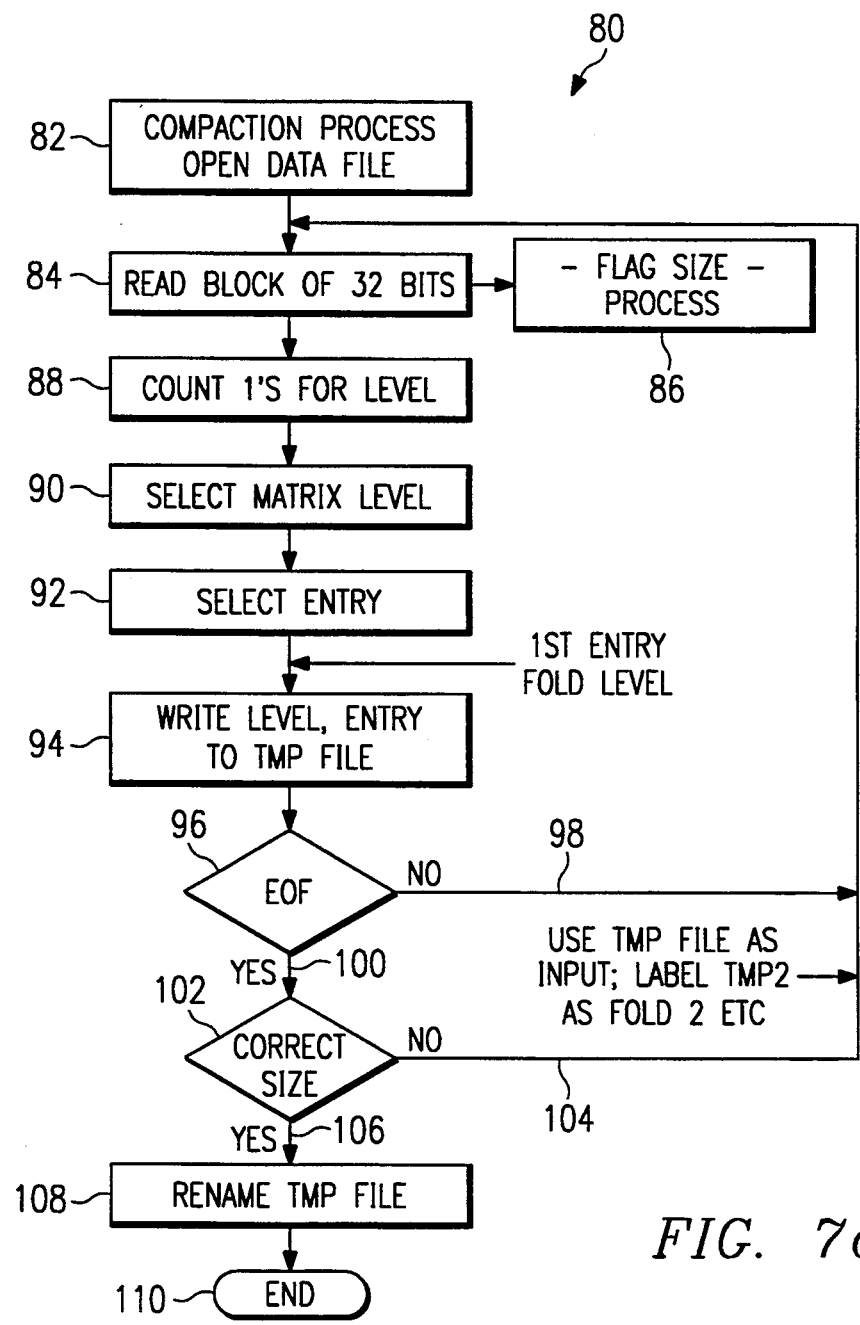
FIGS. 7a and 7b illustrate exemplary flow diagrams for the compaction and explosion methods of the preferred embodiment.

The preferred embodiment of the present invention is best understood by referring to the FIGURES wherein like numerals are used for like and corresponding parts of the various drawings.

FIG. 1 illustrates digital data stream 10 that, for purposes of the preferred embodiment, has been separated into 32-bit BCD blocks such as block 12. BCD block 12, in this example, includes four bytes 14 (i.e., 8-bit segments). In the FIG. 1 example, digital data stream 10 is the BCD equivalent of the "THIS IS A TEST" phrase 16. Digital data stream 10 is a stream of BCD data in the sense that the first bit 18 begins the stream. Proceeding from left to right, the eighth bit is bit 20, and the next or ninth bit is bit 22. Bit 24 of stream 10 is the 32nd bit or last bit of BCD block 12. The next bit 26 of the sequence marks the beginning of a new 32-bit BCD block.

The preferred embodiment has the ability to reduce digital data stream 10 to compacted BCD data set 30 of FIG. 2. BCD data set 30 contains three BCD portions or fields. The first field of compacted BCD data set 30 is fold level field 32. Fold level field 32 contains a fold level parameter and appears only once in compacted BCD data set 30. Other fields that are repeated throughout BCD data set 30 include sequential pairs of bit level fields 34 and unique identifier fields 36. In the example, fold level field 32 is a 4-bit field. Each bit level field 34 is also a 4-bit field, and unique identifier field 36 is a 24-bit field. Fold level field 32 and each bit level field 34 and unique identifier field 36 contains 1's and 0's that, when placed serially together, can be fully and accurately de-compacted or expanded to digital data stream 10 of FIG. 1. The discussions that follow explain the translation and data compaction that the preferred embodiment permits and further illustrate how BCD digital data stream 10 of FIG. 1 may become compacted BCD data set 30 of FIG. 2.

To begin understanding the compaction process of the preferred embodiment, it is helpful to understand the present invention's concepts of folding and data translation. For this purpose, FIG. 3 illustrates conceptually the folding operation of the preferred embodiment. The concept of funnel 40 is appropriate to understand how BCD digital data stream which is represented by bar 10 may be taken to a first fold level to form the first compacted BCD data set that bar 42 represents. First compacted BCD data set 42 will contain fewer BCD digits than BCD digital data stream 10. First compacted data set 42 may serve as a BCD digital data stream for producing the second compacted BCD data set that bar 44 represents, which can yield third compacted BCD data set that bar 46 represents. Third compacted BCD data set 46, through successive folding, yields, for example, final compacted the BCD data set 30, of FIG. 2.

Folding, therefore, essentially includes the steps of using a previously compacted BCD data set as an input BCD digital data stream for further compacting the BCD data. Since all information that the preferred embodiment uses may be expressed in BCD form, the practical limit to the amount of compaction that may be applied to an original BCD digital data stream occurs only when the number BCD data stream folds exceeds the magnitude of fold level field 32 or when the size of the BCD data stream to be compacted is less than or equal to the size of the otherwise resulting BCD data set.

As FIG. 3 further represents by cylindrical portion of funnel 40, compacted BCD data set 30 may be transmitted or stored. After storage or transmission or a combination of steps including either storage or transmission or both steps, compacted BCD data set 30 may be unfolded to produce the BCD digital data stream 10 that has all of the original data that appeared prior to compaction. To illustrate how the present invention performs the translation, compaction and folding of the preferred embodiment, it is necessary to understand the inventive concept of a translation matrix. This is because the translation matrix provides a critical link between the original BCD data stream and all subsequent compacted BCD data sets.

Figure 4:
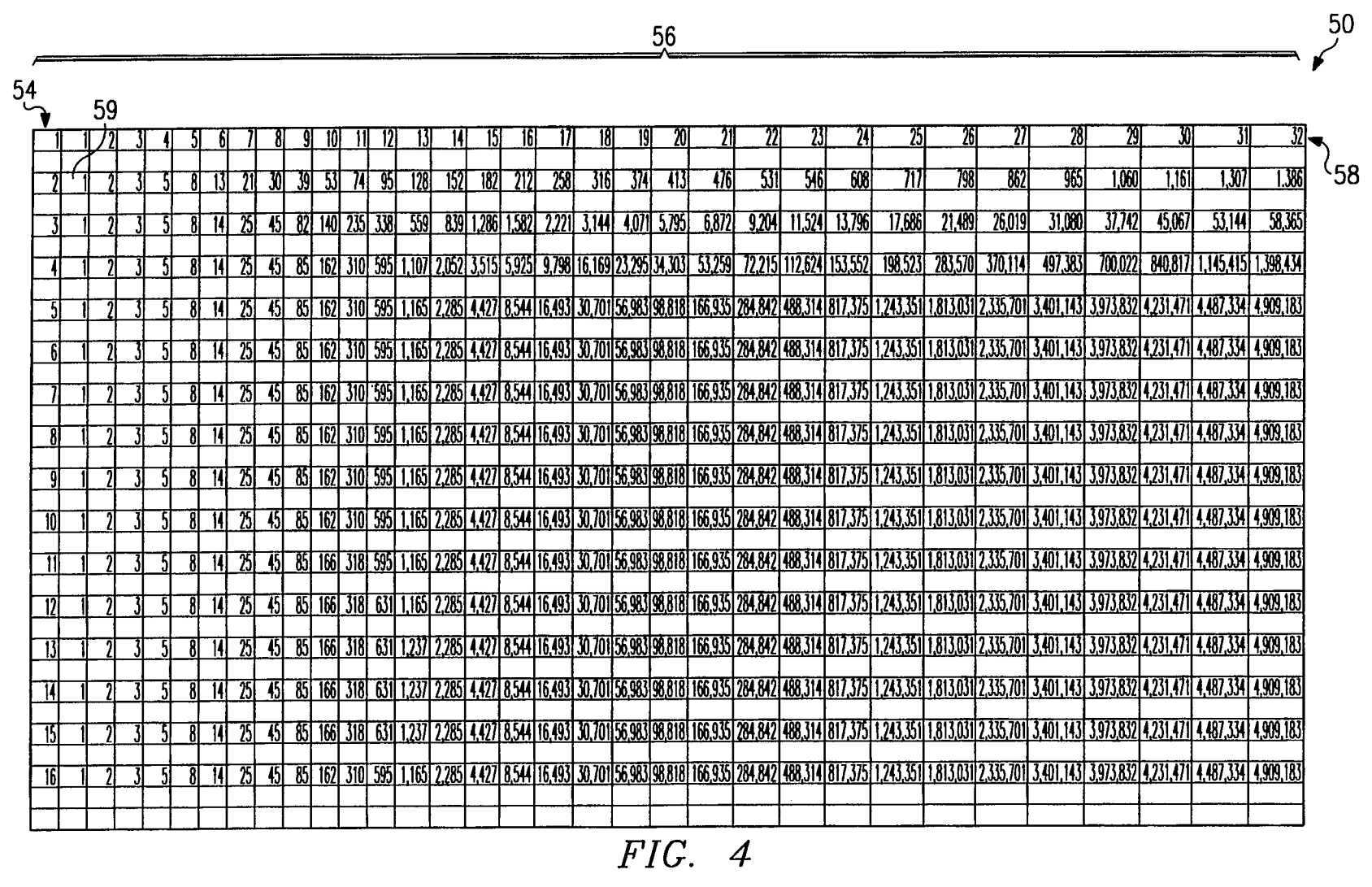

FIG. 4 provides an exemplary translation matrix 50 for translating BCD data to a compacted BCD data set. In FIG. 4, translation matrix 50 includes level rows 52, which have associated with them levels indicated by those values in column 54. In the FIG. 4 translation matrix example, the levels increase vertically downward from 1 through 16. Additionally, translation matrix 50 includes identifier columns 56 having values as indicated in row 58 that range in the example from 1 through 32.

Generally, the number of level rows 52 is one half the number of identifier columns 56. The number of identifier columns corresponds to the number of BCD digits that make up BCD data blocks 12 of the BCD data stream 10. Thus, in the example of FIG. 1, BCD data block 12 has 32 digits, so there are 32 identifier columns in translation matrix 50. Since translation matrix 50 has 32 identifier columns 56, there are 16 level rows 52.

Level rows 52 and identifier columns 56 create identifier cells such as cell 60 that include identifiers. Each identifier is uniquely associated with a particular level row and a particular identifier column. For example, within identifier cell 60 the number "1" uniquely associates with level row 2 and identifier column 1. Each identifier of translation matrix 50 is an additive identifier that relates to a position of a 1 in a 32-bit BCD block such as 32-bit BCD block 12 of FIG. 1.

Translation matrix 50 permits generation of a compacted BCD data set from, in this example, 32-bit BCD blocks. The compacted BCD data set includes a plurality of 28-bit BCD numbers that include a unique row number from level rows 52 and an identifier that derives from the identifiers of identifier columns 56. The resulting BCD number (not counting fold level field 32) is a 28-bit BCD field that is an accurate translation of the 32-bit BCD block. Referring briefly to FIG. 2, it should be noted that the first resulting BCD number includes fold level 32. That is, there is in the resulting BCD data set the 4-bit fold level field followed by successive 28-bit fields each of which includes 4-bit level field 34 followed by the unique identifier field 36. This makes the first 32 bits of compacted BCD data set 30 only correspond to the first 32 bits of the digital data stream. Thereafter, however, the 28-bit block of the compacted BCD data set are 28-bit translations of 32-bit blocks.

An important element of the method of the preferred embodiment, therefore, is the translation of the 32-bit blocks into 28-bit resulting BCD numbers that can be reconverted to the original 32-bit BCD data stream. As already indicated, each level in translation matrix 50 of FIG. 4 indicates the number of 1's in each 32-bit block of BCD digital data stream 10. Each identifier number represents a unique number that has certain properties. In general, each number of each row has the property that, in moving from left to right, the prior numbers add in a unique way up to the number that is the identifier. That is, for example and referring to level row 2, the identifiers are 1, 2, 3, 5, 8, 13, etc. as indicated in matrix 50. Level row 2, corresponds there being two 1's in a 32-bit block. An identifier is used if the sum of the identifiers with any of the previous identifiers can only generate a two element sum in an unique way. That is, beginning at level row 2, the first identifier is the number 1. The second identifier is the number 2.

An additive identifier is a number that results from adding identifiers. In this example, an additive identifier could be the number 3. If the unique additive identifier is 3, then the positions of the 1's in the associated 32-bit block are the first and second bit positions in the 32-bit block. For the next identifier, it is necessary to determine whether an additive identifier can result that has only one way of associating with identifiers in row level 2 of matrix 50. The next possible higher number for an identifier is 3. The step of the preferred embodiment is to test whether an additive identifier, i.e., and identifier resulting from the addition of this third identifier having a value 3 with any other previous identifier can be derived in more than one way. An additive identifier having a value of 5 can only mean that the two ones in the 32-bit block appear in the first position and the third position. An additive identifier of 5 means that the identifiers can only be at the second and third position. Therefore, an identifier of three is an acceptable identifier. For the fourth position, the next higher identifier has a value of 4.

If the value of 4 is chosen, then a resulting additive identifier has a value of 5, i.e., the value of 1 from identifier column 1 and the value of 4 from the identifier column 4. However, since the value appears in identifier column 2 and the value of three appears in identifier column 3, this also adds to five. Since 5 may be derived by adding the identifier in both columns 1 and 4, as well as those of column 2 and 3, selecting 4 as the identifier for column 4 at the two-level is inappropriate. The next possible entry for identifier column number 4 is value 5. The method of the preferred embodiment is to determine whether there is more than one way to derive an additive identifier resulting from adding two previous entries in more than one way. The additive identifier resulting from placing a 5 in identifier column 4 may be 6, 7 or 8. For each of these additive identifiers, there is only one way to use previous identifiers in transition matrix 50 that will result in these additive identifiers.

Carrying these examples one step further, the next step is to determine the value for the identifier in identifier column 6. If a value of 6 is chosen, the resulting additive identifier may be 7, 8, 9, or 11. However, an additive identifier having a value of 7 may be derived by adding the 1 of column 1 and the 6 of column 5. Also, an additive identifier of 7 may be derived by adding 2 of identifier column 2 and 5 of identifier column 4. Therefore, a value of 6 is not acceptable. A value of 7 is also not acceptable because the resulting additive identifier of 8 maybe derived by adding the 1 of column 1 and the 7 of column 5 as well as by adding the 3 of column 3 and 5 in column 4. A value of 8 in identifier column 5, however, will result in an additive identifier having a value of 9 that can only be derived by adding the 1 of column 1 and 8 of column 5. No other additive combination of the identifiers in columns 1 through 5 will result in the additive identifier having a value of 9.

The remainder of the entries in translation matrix 50 are derived in the same fashion. Note, however, that at each level row the number of identifiers summands changes. For example, at level 6 the additive identifier is derived by adding 6 identifiers from level row 6. The additive identifier must be such that there is only one way of adding the six identifiers to produce the resulting additive identifier. Using the same principals as provided in the example of level row 2, it is possible to select the appropriate values for the identifiers in identifier columns 1 through 5 and then to extrapolate the values for the identifier columns 6 through 32. This continues until the identifier values for each intersection of a level row and identifier column is complete. FIG. 4, therefore, provides the values of each identifier from level 1 to level 16 for the example of using 32-bit block of data.

Figure 5A:
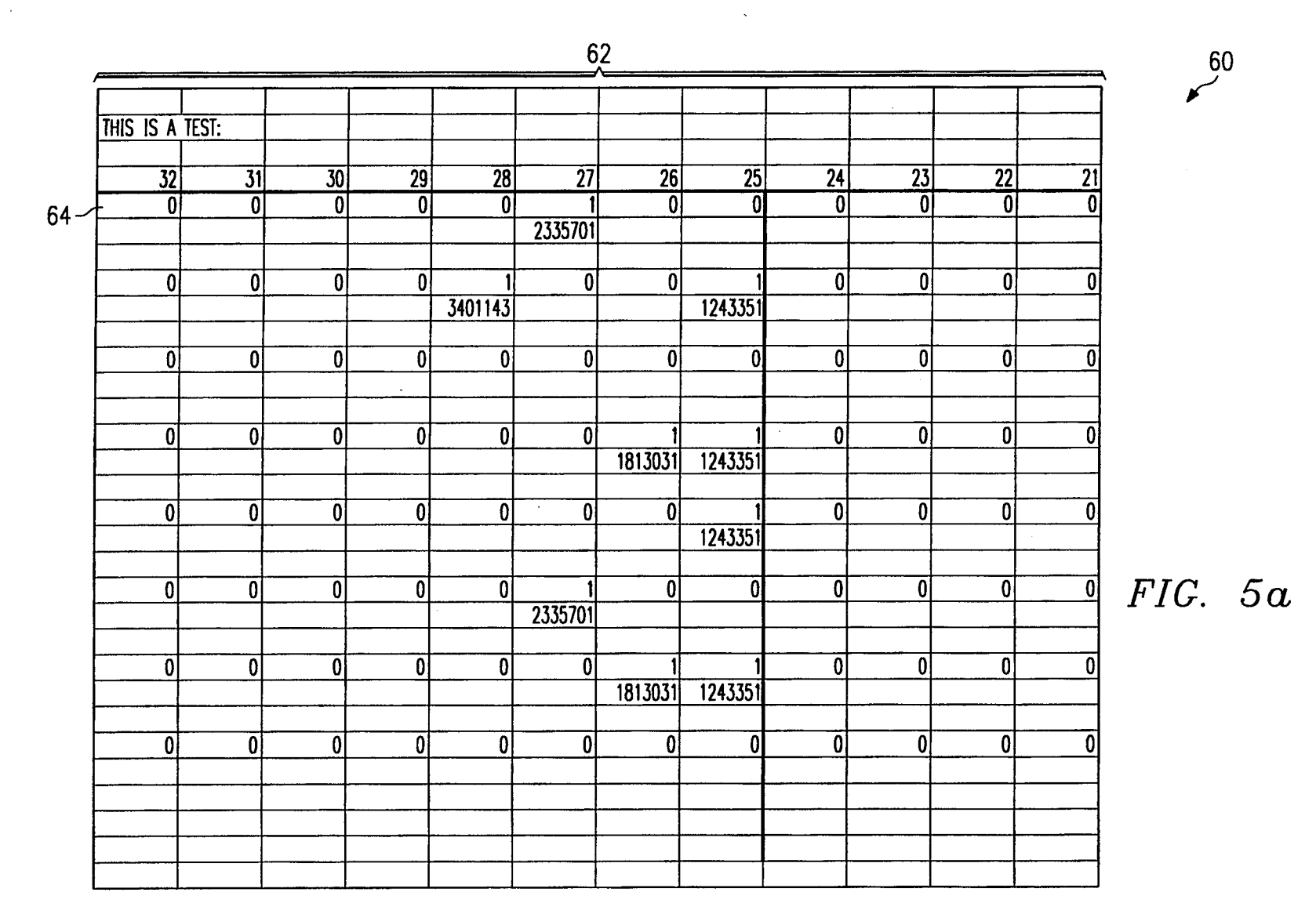

FIG. 5 illustrates applying translation matrix 44 to BCD digital data stream 10 of FIG. 1. In FIGS. 5a through 5c appear contiguous portions that together form intermediate matrix 60 having 32 columns 62 that correspond to identifier columns 56 of translation matrix 50. Intermediate matrix 60 includes all of the bits of the BCD digital data stream of FIG. 1. That is, for example, in column 32 at the position that reference numeral 64 indicates in FIG. 5a appears a 0. This 0 corresponds to the 0 appearing in block 24 of digital data stream 10 of FIG. 5. Referring to FIG. 5e, the 0 in column 8 at the position of reference numeral 66 indicates is the same value of bit 20 at FIG. 1. Furthermore, the 0 in column 1 of FIG. 5e at reference numeral 68 corresponds to the 0 at bit 18 of FIG. 1. At the byte level, beneath the numbers 32 through 25 proceeding from the left to the right appears first byte 14 of digital data stream 10 of FIG. 1. In the same row beneath columns 24 through 17 appears the second byte of data from digital data stream 10. In columns 16 through 9 appears the third byte of data from digital data stream of FIG. 1 and in columns 8 through 1 appears the fourth byte of data from digital data stream.

The 32 entries of this first row of intermediate matrix 60 is the first 32-bit BCD block that the method and system of the preferred embodiment will compact to a 28-bit resulting BCD number (plus the process-generated fold level 4-bit field.) The next 32-bit number begins with the fifth byte of digital data stream 10 and is placed in the second row beneath columns 32 through 25 of matrix 60. As can be seen, each of the bytes in digital data stream 10 of FIG. 1 may be used to form part of a 32-bit block that the translation process of the preferred embodiment performs.

Having explained the values for the identifiers in translation matrix 50 of FIG. 4 and after introducing intermediate matrix 60 of FIG. 5, it is now possible to explain how translation matrix 50 generates intermediate matrix 60. Referring to FIG. 5, as previously described, there are included the BCD values for each of the bits in digital data stream 10 of FIG. 1. Data stream 10 has been partitioned into numerous 32-bit blocks. Each of the 32-bit blocks has been entered into intermediate matrix 60 and associated with an identifier column to yield for the particular 1 identifier. For example, the first byte of the 32-bit block has the BCD value 01100000, the second byte has the value 00010000, the third byte has the value 10100000, and the fourth byte the value 00100000. So, for example, applying translation matrix 50 to this 32-bit block associates with the 1 of identifier column 2 the identifier value 2, the 1 of identifier column 3 with the value 3, the 1 of identifier column 12 with the value 595, the 1 of identifier column 17 with the value of 16,393, the 1 of identifier column 19 with the value 56,683 and the 1 of identifier column 27 with the value of 2,335,701.

This 32-bit block comprising the four above-stated bytes, therefore, may be translated using intermediate matrix 60 into a number that includes at a minimum associated the bit level and additive identifier. In this example, the decimal translation has the value of 6 to indicate that the 32-bit BCD block has six 0's and the unique additive identifier is 2,409,577. That is, the additive identifier in this instance is the sum 2,335,701+56,783+16,493+595+3+2=2,409,577.

For the 32-bit blocks in digital data stream 10, Table 5 provides a listing of the bit levels and associated additive identifiers.

TABLE 5

| Fold Level 1 Compacted BCD Data Set | |
|---|---|
| Bit Level | Additive Identifier |
| 6 | 2,409,577 |
| 9 | 4,732,231 |
| 5 | 87,957 |
| 6 | 3,160,361 |

TABLE 5-continued

| Fold Level 1 Compacted BCD Data Set | |
|---|---|
| Bit Level | Additive Identifier |
| 4 | 1,330,837 |
| 8 | 2,440,078 |
| 9 | 3,160,675 |
| 1 | 30,701 |

Table 5 illustrates the first fold of the process of the preferred embodiment. Subsequent folds are performed in a similar manner. The first step in performing subsequent folds, referring for example to FIG. 2, is to know the fold level field 32 and to translate the bit level field 34 and additive identifier field 36 into a BCD data stream. This BCD data stream is then used as an input to the process of translating the BCD data to a compacted BCD data set that includes a single fold level field 20 and a plurality of associated bit level fields and additive identifier fields 24. Each associated pair of bit level field 22 and additive identifier field 24 requires 28 bits in this example. As can be seen in this example, a compaction of 4 bits for every 32-bit block results.

To begin the next level of compaction, the previous level's BCD digital data stream is feed into the matrix 60 of FIGS. 5a through 5c. At this next level another savings of 4 bit per 32-bit block can occur using the previously described techniques. This process can continue until the resulting compacted BCD data set has the desired size or is limited as described above. FIGS. 6a through 6d, for example, show the decimal equivalent form of the compacted BCD data set four sequential fold levels. That is, the level one translation that yield appears decimal equivalent table 70 in FIG. 6a. Decimal equivalent table 72 represents fold level two for the next compacted BCD data set in FIG. 6b. Decimal equivalent table 74 shows translation results at fold level three in FIG. 6c. Finally, decimal equivalent table 76 represents fold level four in FIG. 6d. The BCD data sets that these decimal equivalent tables 70 through 76 represent are the inputs into intermediate matrix 60 for performing the data translation.

The preferred embodiment of the present invention includes an automated process for compacting BCD digital data stream into BCD data sets. For this purpose, FIG. 7 shows a flow diagram 80 of the compaction process of the preferred embodiment. In flow chart 80, the first step at block 82 is to open the data file in order to read the digital data stream. Block 84 illustrates, for example, reading digital data stream 10 in 32-bit blocks. Part of the process of the preferred embodiment is to determine whether there are more 1's than 0's and whether the greater percentage of 1's appear in the higher numbered identifier columns. In the event there are more 1's than 0's in the 32-bit data block, the method of the preferred embodiment, instead of counting the number of 1's in the 32-bit data block, is to count the number of 0's in the 32-bit data block. Likewise, if the greater percentage of 1's is in the higher numbered columns of the 32-bit data block such that the resulting sum exceeds the maximum value that the 24-bit additive identifier field 24 can contain, the method is to select to count the number of 0's instead of the number of 1's. This step is indicated by block 86 of flow chart 80.

Once the decision of whether to count 0's or 1's is made, the next step is to count to determine the bit level, i.e., the number of 1's within the 32-bit block as block 88 represents. At the step that block 90 indicates, selection of the proper translation matrix 50 level row 52 occurs. Block 92 represents the step of selecting the proper value for each of the identifiers from the identifier columns of the applicable level row and then adding each of these identifiers to generate the appropriate entry or additive identifier for the resulting BCD number. The resulting BCD number will have 28-bits for characterizing the original 32-bit block. This 28-bit number is then written to a temporary file as indicated by block 94.

Query 96 is a test of whether the end of the BCD digital data stream is present. If not, then flow proceeds along path 98 to return to block 84 at which point another 32-bit block is read. On the other hand, if the end of the BCD data field is present, program flow follows path 100 to query 102. At query 102, a test is made of whether the resulting compacted BCD data set is of the correct or desired size. If the compacted BCD data set is not of the correct size, then flow control proceeds along path 104 at which point the fold level indicator is incremented by a pre-determined amount, such as an increment of 1. The compacted BCD data set that the previous level generated is then used as an input for forming 32-bit blocks that will become 24-byte resulting BCD numbers at the next higher fold level. This process may continue until the correct size is positively tested as determined at query 102. Once the compacted BCD data set is of the desired size, flow control follows path 106 to block 108 at which point the compacted BCD data set is named and may be stored. The compaction process of the preferred embodiment may then terminate as block 110 represents.

Figure 7B:
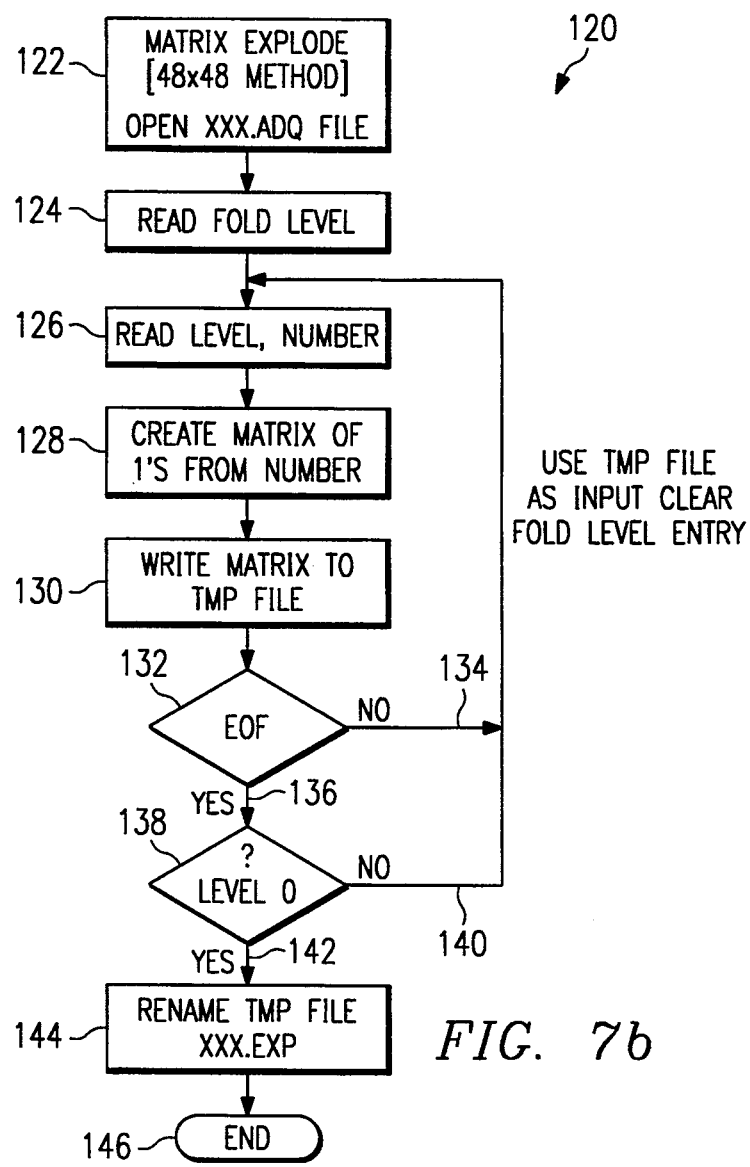

FIG. 7b represents the reverse process of exploding or expanding the compacted BCD data set by reversing the process of applying intermediate matrix 60 of FIG. 5. Flow chart 120 of FIG. 7a begins at block 122 where a file containing a compacted BCD data set such as compacted BCD data set 30 of FIG. 2 above. Upon reading the compacted BCD data set, the first piece of information to extract is the fold level from fold level field 20. Fold level field 20 is followed by numerous 28-bit blocks, as described above, that include the 4-bit level row number and the associated additive identifier as block 126 indicates. After reading the 28-bit BCD number a 32-bit data block can be produced as the next step as block 128 represents. This 32-bit block is then stored temporarily as block 130 indicates.

Query 132 examines whether the end of the compacted BCD data set is reached. If not, program flow continues along path 134 to return to block 126 where the next 28-bit block is read. If the end of the compacted BCD data set is reached, then flow proceeds along path 136 to query 138. At query 138, the question of whether the method is at level zero occurs. If the resulting data is not at level zero, i.e., the same as the original BCD digital data stream (e.g., BCD digital data stream 10 of FIG. 1), then program flow proceeds along path 140 to use the previously expanded BCD data as the input file and proceeds to block 126. If level zero has been reached, then program flow proceeds along path 142 to block 144 at which point the resulting data will be the original BCD data stream that was previously compacted. This concludes the method of flow chart 120 at block 146.

Figure 8:
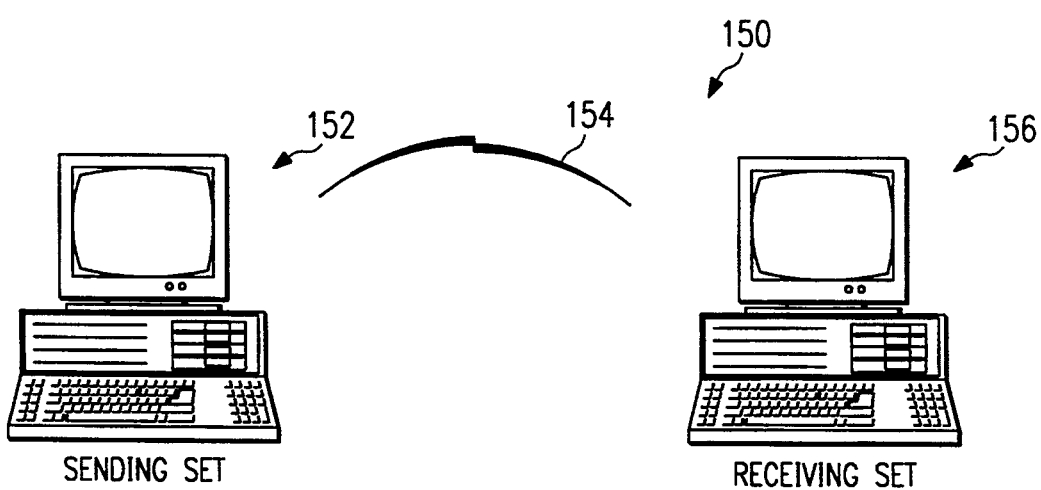
FIG. 8 illustrates an exemplary data communications system formed consistent with certain concepts of the preferred embodiment.

FIG. 8 illustrates an exemplary system that may use the method of the preferred embodiment. For example, a system 150 may include a first personal computer 152 that contains in associated memory a matrix such as translation matrix 50 and a file that includes a BCD digital data stream such as BCD digital data stream 10 of FIG. 1. Through a communication path such as communication path 154, computer 152 may communicate with computer 156 to transmit a compacted BCD data set such as compacted BCD data set 30 of FIG. 2. Communication path 154 may be, for example, a satellite connection, a telephone transmission line, or another type of communication path. Computer 156 includes the necessary instructions and memory to perform the process of flow chart 120 of FIG. 7b, while computer 152 may include the necessary instructions and memory to perform the process of flow chart 80 of FIG. 7a.

With data compacted in the way that the present invention provides, it is possible to transmit a tremendous amount of digital data in a very short amount of time. All that is required at the transmitting end is to first compact the data according to the process of the preferred embodiment. Upon receiving the compacted BCD data set, a computer such as computer 156 of FIG. 9 may expand the data to produce the identical BCD digital data stream from which the compacted BCD data set originated.

This type of system has numerous applications including for video imagery files, textual data files and other types of files. These applications include education, entertainment, as well as document storage and retrieval. A particularly important aspect of the preferred embodiment is that through the translation that translation matrix 50 makes possible a secure mode of transmission results. Only at the fold level zero does the original BCD digital data stream have its original meaning. After fold level zero, the compaction data is essentially encrypted into the compacted BCD data sets. This has very attractive aspects in the interest of system security. Another important difference between the method and system of the preferred embodiment and other data comparison methods and systems is that no data loss occurs during compaction. In prior compression techniques, data losses as much as 30 to 40% are not unusual. This seriously affects the data that is subsequently decompressed to yield a file resembling the original data. The preferred embodiment has no such limitation.

In summary, there is provided a method and system for generating a compacted BCD data set from a BCD digital data stream. The method and system include the steps and necessary instructions and circuitry for partitioning the BCD digital data stream into a plurality of BCD blocks. Each BCD block includes a pre-determined number of digits such as 32 digits or 32 bits. The method and system further create a translation matrix that has a plurality of level rows such of the plurality of level rows has a unique row number that corresponding to a possible number of 1's in the BCD block. The translation matrix further has a plurality of identifier columns equal in number to the number of digits in the BCD block. The identifier columns uniquely correspond to the relative position of the 1's in the BCD block. Furthermore, the translation matrix includes a plurality of identifiers such that each of the identifiers uniquely associates with one of the level rows and one of the identifier columns.

In compacting the BCD digital data stream one of the first steps is to set a fold level parameter to 1. The next step is to generate the compacted BCD data set from the plurality of BCD blocks and use the translation matrix by sequentially performing translation and compaction steps on each of the BCD blocks. The steps include reading the BCD block and determining the number of 1's in the BCD block. After determining the number of 1's in the BCD block, the next step is to identify a corresponding level row of the translation matrix that corresponds to the number 1's in the BCD block. The next step is to locate the set of identifiers in the corresponding level row such that each of the identifiers is within an identifying column that corresponds to a position of a 1 in the BCD block. The next step is to add the set of identifiers to form a unique identifier number. The invention further includes the steps and components for storing the full level parameter, the corresponding unique row number and the unique identifier number in combination as a resulting BCD number. The resulting BCD number has fewer digits than the BCD block and is in sequence with any previously stored resulting BCD numbers. The above steps are repeated to form the compacted BCD data sets.

Although the invention has been described with reference to the above-specified embodiments this description is not meant to be construed in a limiting sense. Various modifications of the disclosed embodiment, as well as alternative embodiments of the invention will become apparent to persons skilled in the art upon reference to the above description. It is, therefore, contemplated that the appended claims will cover such modifications that fall within the true scope of the invention.

What is claimed is:

1. A method for generating a compacted binary coded decimal (BCD) data set from a digital data stream, the method comprising the steps of:
    partitioning the digital data stream into a plurality of BCD blocks each comprising a pre-determined equal number of digits;
    creating a translation matrix having a plurality of level rows such that each of said plurality of level rows has a unique row number corresponding to a possible number of 1's in said BCD block, said translation matrix further having a plurality of identifier columns equal in number to said number of digits and further such that each of said identifier columns uniquely corresponds to the relative position of one of the digits in said BCD block and further such that said translation matrix comprises a plurality of identifiers where each of said identifiers uniquely associates with one of said level rows and one of said identifier columns;
    setting a fold level parameter to 1;
    generating said compacted BCD data set from said plurality of BCD blocks and using said translation matrix by sequentially performing the following steps on each of said BCD blocks:
    (a) reading said BCD block;
    (b) determining the number of 1's in said BCD block;
    (c) identifying a corresponding level row of said translation matrix that corresponds to the number of 1's in said BCD block;
    (d) locating a set of identifiers in said corresponding level row such that each of said identifiers is within an identifier column that corresponds to the position of a 1 in said BCD block;
    (e) adding said set of identifiers to form a unique identifier number;
    (f) storing said fold level parameter, said corresponding unique row number and said unique identifier number in combination as a resulting BCD number, said resulting BCD number having fewer digits than said BCD block and being in sequence with any previously stored resulting BCD number; and
    (g) repeating steps (a) through (f) to form said compacted BCD data set.

2. The method of claim 1, further comprising the steps of:
    (h) determining whether said compacted BCD data set has a size less than a pre-determined size;
    (i) in the event that the compacted BCD data set exceeds said pre-determined size,
        (1) increasing said fold level parameter by a predetermined amount; and
        (2) repeating steps (a) through (h); and
    (j) in the event that the compacted BCD data set at most equals said pre-determined size, storing said compacted BCD data set.

3. The method of claim 1, wherein said digital data stream comprises a stream of digital data representing a video imagery data file.

4. The method of claim 1, wherein said digitial data stream represents a textual data file.

5. The method of claim 1, further comprising the step of transmitting said compacted BCD data set from a first location to a second location.

6. The method of claim 1, further comprising the step of selecting each of said identifiers in said translation matrix such that each identifier is a sum of a unique set of other identifiers.

7. The method of claim 2, wherein said determining step further comprises the step of determining whether said compacted BCD data set has a size less than a predetermined size approximately equivalent to the size of one of said BCD blocks.

8. A method for generating a digital data stream from a compacted binary coded decimal (BCD) data set, the method comprising the steps of:
    partitioning said BCD data set into a fold level field having a pre-determined size, a plurality of bit level fields and a plurality of unique identifier fields such that each of said identifier fields associates with a unique one of said bit level fields, said unique identifier fields containing a unique identifier number and said bit level fields containing a unique row number, said unique row number corresponding to a unique level row corresponding to a number of 1's in a BCD block of a pre-determined size;
    said unique identifier number comprising the addition of a set of identifiers, said set of identifiers derived from said level row of said translation matrix such that each of said set of identifiers is within an identifier column corresponding to the position of a 1 in said BCD block;
    said level rows of said translation matrix being one of a plurality of level rows each having a unique row number corresponding to a possible number of 1's in said BCD block, said identifier column being one of a plurality of identifier columns in said translation matrix, said identifier columns being equal in number to the number of digits in said BCD block each of said identifier columns associating with each of said level rows to form a plurality of identifier cells such that each of said identifier cells contains an associated identifier within said set of identifiers;
    generating a BCD block of a pre-determined size for each of said unique row number and unique identifier number pairs; and forming a digital data stream from said BCD blocks by sequentially associating each of said BCD blocks formed from each sequential pair of unique row number and unique identifier number.

9. An computer program for generating a compacted binary coated decimal (BCD) data set from a digital data stream, the computer program comprising:
  instructions for partitioning the digital data stream into a plurality of BCD blocks each comprising a predetermined equal number of digits;
  instructions for applying a translation matrix to said BCD blocks, said translation matrix having a plurality of level rows such that each of said plurality of level rows has a unique row number that corresponds to a possible number of 1's in said BCD block, said translation matrix further having a plurality of identifier columns equal in number to said number of digits and further such that each said identifier columns uniquely corresponds to the relative position of one of the digits in said BCD block and further such that said translation matrix comprises a plurality of identifiers where each of said identifiers uniquely associates with one of said of level rows and one of said identifier columns;
  instructions for setting a fold level parameter to 1;
  instructions for generating said compacted BCD data set from said plurality of BCD blocks, said generating instructions further including the following instructions;
  (a) instructions for reading said BCD block;
  (b) instructions for determining the number of 1's in said BCD block;
  (c) instructions for identifying a corresponding level row of said translation matrix that corresponds to the number of 1's in said BCD block;
  (d) instructions for locating a set of identifiers in said corresponding level row such that each of said identifiers is within an identifier column that corresponds to the position of a 1 in said BCD block;
  (e) instructions for using said set of identifiers to form an unique identifier number;
  (f) instructions for storing said fold level parameter, said corresponding unique row number, and said unique identifier number in combination as a resulting BCD number, said instructions further comprising instructions for causing said resulting BCD number to have fewer digits than said BCD block and being in sequence with any previously stored resulting BCD number; and
  (g) instructions for repeating steps (a) through (f) to form said compacted BCD data set.

10. (Amended) The computer program of claim 9, further comprising:
  (h) instructions for determining whether said compacted BCD data set has a size less than a predetermined size;
  (i) instructions for performing the following steps in the event that the compacted BCD data set exceeds said predetermined size:
    (1) increasing said fold level parameter by a predetermined amount; and
    (2) instructions for executing instructions (a) through (h) in response to said fold level parameter parameters increasing by said pre-determined amount; and
  (j) instructions for storing said compacted BCD data set in the event that said compacted BCD data set at most equals said pre-determined size.

11. The computer program of claim 9, wherein said partitioning instructions further comprise instructions for partitioning a digital data stream formed from a video imagery file.

12. The computer program of claim 9, wherein said partitioning instructions further comprising instructions for partitioning a digital data stream formed from a textual data file.

13. The computer program of claim 9, further comprising instructions for transmitting said compacted BCD data set from a first location to a second location.

14. The computer program of claim 9, further comprising instructions for executing instructions (a) through (h) until said compacted BCD data set approximates the size of one of said BCD blocks.

15. A system for generating and transmitting a compacted BCD data set, comprising:
  a first work station and a second work station, said first work station comprising a digital data stream and instructions for compacting a digital data stream into a compacted binary coded decimal (BCD) data set, said instructions comprising:
  instructions for partitioning the digital data stream into a plurality of BCD blocks each comprising a predetermined equal number of digits;
  instructions for creating a translation matrix having a plurality of level rows such that each of said plurality of level rows has a unique row number corresponding to a possible number of 1's in said BCD block, said translation matrix further having a plurality of identifier columns equal in number to said number of digits and further such that each of said identifier columns uniquely corresponds to the relative position of one of the digits in said BCD block, and further such that said translation matrix comprises a plurality of identifiers where each of said identifiers uniquely associates with one of said level rows and one of said identifier columns;
  instructions for setting a fold level parameter to 1;
  instructions for generating said compacted BCD data set from said plurality of BCD blocks and using said translation matrix, including the following instructions:
    (a) instructions for reading said BCD block;
    (b) instructions for determining the number of 1's in said BCD block;
    (c) instructions for identifying a corresponding level row of said translation matrix that corresponds to the number of 1's in said BCD block;
    (d) instructions for locating a set of identifiers in said corresponding level row such that each of said identifiers is within a identifier column that corresponds to the position of a 1 in said BCD block;
    (e) instructions for adding said set of identifiers to form an unique identifier number;
    (f) instructions for storing said fold level parameter, said corresponding unique row number, and said unique identifier number in combination as a resulting BCD number, said instructions further comprising instructions for causing said resulting BCD number to have fewer digits than said BCD block and being in sequence with any previously stored resulting BCD number; and
    (g) instructions for repeatedly executing instructions (a) through (f) to form said compacted BCD data set;
  a communication path between said first work station and said second work station; and
  said second work station comprising instructions for creating said translation matrix and instructions for generating said digital data stream from said compacted BCD data set.

* * * * *

UNITED STATES PATENT AND TRADEMARK OFFICE
CERTIFICATE OF CORRECTION

PATENT NO. : 5,351,046
DATED : Sep. 27, 1994
INVENTOR(S) : Adcox

It is certified that error appears in the above-identified patent and that said Letters Patent is hereby corrected as shown below:

Title page, item [56] "3,912,210  11/1975  Halpern", and insert
--3,921,210  11/1975  Halpern--.

Column 1, Line 35    After "transmission time", delete "," and insert --.--.

Column 8, Line 19    After "bit level fields", insert --22--.

Signed and Sealed this

Fifth Day of September, 1995

Attest:

BRUCE LEHMAN

Attesting Officer    Commissioner of Patents and Trademarks